United States Patent [19]
Datta et al.

[11] Patent Number: 6,103,096
[45] Date of Patent: Aug. 15, 2000

[54] APPARATUS AND METHOD FOR THE ELECTROCHEMICAL ETCHING OF A WAFER

[75] Inventors: Madhav Datta, Yorktown Heights; Daniel Charles Edelstein, New Rochelle; Cyprian Emeka Uzoh, Hopewell Junction, all of N.Y.

[73] Assignee: International Business Machines Corporation, Armonk, N.Y.

[21] Appl. No.: 08/968,190

[22] Filed: Nov. 12, 1997

[51] Int. Cl.[7] .............................. H05K 3/07; C25D 17/00
[52] U.S. Cl. .......................... 205/686; 205/670; 204/212
[58] Field of Search .......................... 204/297 R, 224 M, 204/237, 242, 212; 205/686, 670

[56] References Cited

U.S. PATENT DOCUMENTS

| | | |
|---|---|---|
| 1,166,378 | 12/1915 | Levy . |
| 1,393,315 | 10/1921 | Robertson . |
| 2,689,216 | 9/1954 | Nevers et al. .............................. 204/52 |
| 2,923,671 | 2/1960 | Van Tilburg .............................. 204/52 |
| 3,300,396 | 1/1967 | Walker .................................... 204/49 |
| 3,317,410 | 5/1967 | Croll et al. .............................. 204/23 |
| 3,558,464 | 1/1971 | Danna ................................... 204/219 |
| 3,652,442 | 3/1972 | Powers et al. .......................... 204/273 |
| 3,808,071 | 4/1974 | Lerner ..................................... 156/16 |
| 3,809,642 | 5/1974 | Bond et al. ............................. 264/275 |
| 3,953,276 | 4/1976 | Glorioso et al. ........................ 156/345 |
| 3,962,047 | 6/1976 | Wagner .............................. 204/DIG. 7 |
| 3,986,911 | 10/1976 | Lerner ...................................... 156/8 |
| 4,032,422 | 6/1977 | Ross et al. .......................... 204/224 R |
| 4,118,303 | 10/1978 | Gibbs ................................. 204/224 R |
| 4,233,416 | 11/1980 | Rothmayer et al. .................... 204/255 |
| 4,304,641 | 12/1981 | Grandia et al. .......................... 204/23 |
| 4,323,438 | 4/1982 | Sesterhenn et al. .................... 204/128 |
| 4,466,864 | 8/1984 | Bacon et al. ............................. 204/15 |
| 4,469,564 | 9/1984 | Okinaka et al. .......................... 204/15 |
| 4,596,637 | 6/1986 | Kozarkek et al. ........................ 204/67 |
| 4,664,760 | 5/1987 | Jarrett ....................................... 204/67 |
| 4,906,341 | 3/1990 | Yamakawa et al. ...................... 204/15 |
| 4,931,150 | 6/1990 | Smith ........................................ 204/26 |
| 4,966,647 | 10/1990 | Siegmund et al. ...................... 156/640 |
| 5,000,827 | 3/1991 | Schuster et al. .......................... 204/15 |
| 5,023,044 | 6/1991 | Negron ................................... 376/213 |
| 5,152,878 | 10/1992 | Datta et al. .......................... 204/141.5 |
| 5,222,310 | 6/1993 | Thompson et al. ...................... 34/202 |
| 5,228,966 | 7/1993 | Murata ............................... 204/224 R |
| 5,284,554 | 2/1994 | Datta et al. .......................... 204/129.5 |
| 5,308,447 | 5/1994 | Lewis et al. ............................ 156/626 |
| 5,318,683 | 6/1994 | Smith et al. ............................ 204/252 |
| 5,377,708 | 1/1995 | Bergman et al. ....................... 134/105 |
| 5,391,285 | 2/1995 | Lytle et al. ............................. 205/123 |

(List continued on next page.)

OTHER PUBLICATIONS

D. Edestein, "Advantages of Copper Interconnectors," Jun. 27–29, 1995, VMIC Conference—1995 ISMIC—104/95/0301 Jun. 1995.

D. Edestein, et al., "Full Copper Wiring in a Sub–0.25 um CMOSULSI Technology," IEEE IEDM, Washington, D.C. Dec. 7–10 (1997) pp. 301–307.

D. Edelstein, "Integration of Copper Interconnects," ECS 1996 Month Not Available.

Equinox, Single Substrate Processing System, Semitool. Advertising Brochure. EQU–025, Apr. 1994 pp. 108.

*Primary Examiner*—Kishor Mayekar
*Assistant Examiner*—Erica Smith-Hicks
*Attorney, Agent, or Firm*—Ratner & Prestia; Joseph P. Abate

[57] ABSTRACT

An electrochemical etching apparatus and method increasing the rate at which material is removed from a substrate such as a metallic surface. The apparatus includes an electrolyte delivery system positioned below and centered beneath the center of the substrate (e.g., a wafer) to be etched so that the center axis of the delivery system corresponds to the center of the wafer. The electrolyte delivery system and the wafer are then rotated relative to each other as the electrolyte is discharged from the delivery system and toward the surface of the wafer. A corresponding method for electrochemically etching a surface of the wafer with an electrolyte is also provided.

30 Claims, 4 Drawing Sheets

U.S. PATENT DOCUMENTS

| | | | |
|---|---|---|---|
| 5,421,987 | 6/1995 | Tzanavaras et al. | 205/133 |
| 5,429,733 | 7/1995 | Ishida | 204/224 R |
| 5,431,823 | 7/1995 | Gofer | 210/636 |
| 5,435,885 | 7/1995 | Jones et al. | 216/92 W |
| 5,437,777 | 8/1995 | Kishi | 204/224 R |
| 5,443,707 | 8/1995 | Mori | 204/242 |
| 5,447,615 | 9/1995 | Ishida | 204/224 R |
| 5,486,282 | 1/1996 | Datta et al. | 205/123 |
| 5,543,032 | 8/1996 | Datta et al. | 205/670 |
| 5,807,165 | 9/1998 | Uzoh et al. | 451/41 |
| 5,865,984 | 2/1999 | Corbin, Jr. et al. | 205/670 |
| 5,911,619 | 6/1999 | Uzoh et al. | 451/5 |

APPARATUS AND METHOD FOR THE ELECTROCHEMICAL ETCHING OF A WAFER

TECHNICAL FIELD

The present invention generally relates to the electrochemical etching of a substrate surface and, more particularly, to an apparatus and method for increasing the rate at which material is removed from a metallic surface.

BACKGROUND OF THE INVENTION

Electroetching is one of a number o f methods commonly used to remove metal from the surface of a metallic workpiece (i.e., a substrate) to provide the workpiece with an etched surface layer. In the electroetching method, the surface to be etched forms the anode of an electrolytic cell and a counter electrode (i.e., the cathode) is appropriately positioned to complete the cell. A suitable electrolyte is then directed onto the metal surface (i.e., the anode) while an electric current is applied to the system, leading to an accelerated etching of the metallic surface.

In the microelectronics industry, such electroetching is commonly used for through-mask patterning and for the removal of a continuous thin film of conducting metal (such as seed layers) from the surface of a semiconductor wafer. Different types of electroetching apparatus of this general type are known, and the literature describes a variety of electrolyte flow systems for use with such apparatus ranging from non-agitated to impinging electrolyte jets.

Completely submerged electroetching systems are often used for the electroetching of relatively large wafer layers, on the order of 200 mm in diameter. In practice, however, completely submerged electroetching systems tend to pose certain problems including high power requirements and edge effects that can lead to the loss of electrical connection with the metal film.

In order to alleviate such problems, U.S. Pat. No. 5,284,554 (Datta et al.) and U.S. Pat. No. 5,486,282 (Datta et al.) disclose an electroetching system which progressively treats only a small portion of the wafer to be etched. To this end, a multi-nozzle cathode assembly is provided which has a small width relative to the overall dimensions of the wafer (surface) to be etched. This cathode assembly is then used to deliver the electrolyte to limited portions of the wafer (i.e., the wafer surface facing the cathode assembly) as the nozzle assembly is scanned across the surface of the wafer. In this way, the surface area of the wafer which is at any given time exposed to the electrolyte is limited, and will be responsive to the location of the cathode assembly (i.e., the nozzle assembly) relative to the wafer being etched.

In operation, the electroetching system disclosed by the patents issued to Datta et al. is operated at a constant cell voltage, which in turn allows for adjustment of the etching current based on the exposed surface area which is encountered. Movement of the nozzle assembly is adjusted to match the rate at which the film is to be etched so that wafer etching can be completed in one pass.

Because conventional wafers have a generally circular shape, however, the scanning system of Datta et al. will encounter a surface area which varies as the cathode assembly is scanned across the wafer. A maximum surface will be exposed toward the middle of the wafer, while a minimal surface will be exposed at the ends (leading and trailing) of the wafer. This has been found to lead to nonuniformities which, in operation, can limit the overall etching rate for the wafer.

The deficiencies of the conventional electroetching systems show that a need still exists for an improved system. Therefore, the primary object of the present invention is to provide an improved electrochemical etching system for removing metal from the surface of a wafer. Another object of the present invention is to provide an improved electrochemical etching system for removing metal from the surface of a wafer at an increased rate. A further object of the present invention is to provide an improved electrochemical etching system for removing metal from the surface of a wafer which is well adapted to the shape of the wafer to be etched.

SUMMARY OF THE INVENTION

To achieve these and other objects, and in view of its purposes, the present invention provides an electrochemical etching apparatus, and a corresponding method, in which the electrolyte delivery system is positioned below, and centered beneath, the middle of the wafer so that the center axis of the delivery system corresponds to the center of the wafer. The electrolyte delivery system and the wafer are then rotated relative to each other as the electrolyte is discharged from the delivery system and toward the surface of the wafer which is to be etched.

In a preferred embodiment, the electrolyte delivery system is configured as a tubular head having a plurality of nozzles extending across the top plate of the head. The head is received by a shaft having an axis which is positioned to align with the center of a wafer positioned over the resulting head assembly. The wafer and the head assembly are then rotated relative to each other so that electrolyte discharged from the nozzles associated with the top plate impinges upon the surface portions of the wafer which are then addressed by the head assembly. This in turn results in a uniform application of electrolyte to the wafer surface as the wafer and the head assembly are rotated relative to each other. Further refinements in uniformity can be achieved by varying the size, number, or both size and number of nozzles formed in the top plate of the head, to compensate for edge effects which occur during the etching process.

For further discussion of the apparatus and method of the present invention, reference is made to the detailed description which is provided below, taken in conjunction with the following drawing. It is to be understood that both the foregoing general description and the following detailed description are exemplary, but are not restrictive, of the invention.

DETAILED DESCRIPTION OF THE INVENTION

Figure 1:
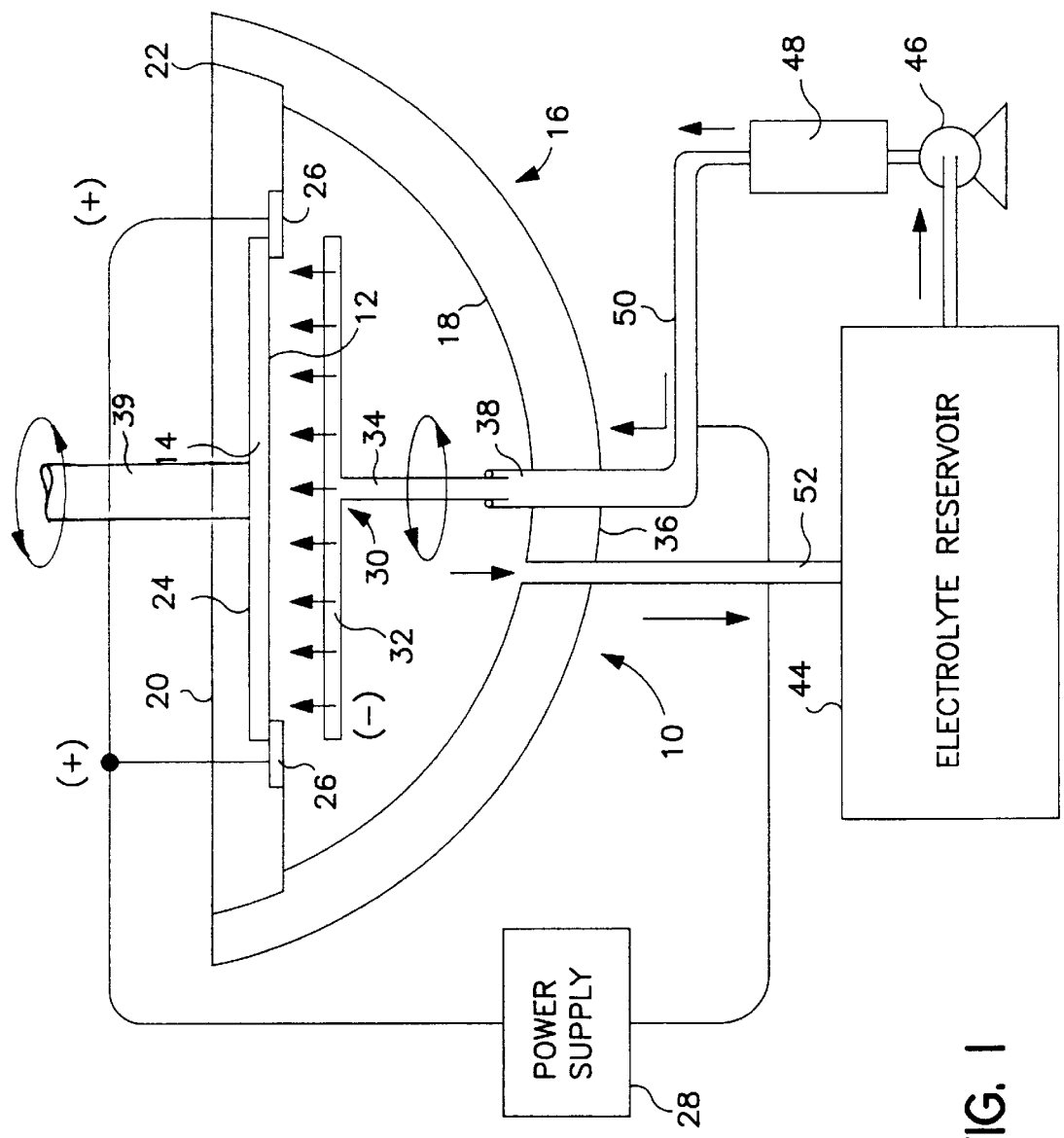
FIG. 1 is a cross-sectional view of an electrochemical etching apparatus produced in accordance with the present invention.

FIG. 1 shows an apparatus 10 for electrochemically etching a surface 12 of a substrate, such as the wafer 14. The apparatus 10 is generally formed as a cup-shaped cell 16 having sloping sides 18. The cup-shaped cell 16 is enclosed by a sealing cover 20. Both the sides 18 and the cover 20 of the cup-shaped cell 16 are preferably made of a plastic material to resist the corrosive effects of the electrolyte used in the electroetching process. For similar reasons, the sides 18 of the cup-shaped cell 16 are preferably mated with the perimeter 22 of the cover 20 to form a fluid-tight seal at this interface.

The cover 20 includes a holder 24 for receiving the wafer 14 to be etched. The holder 24 may be a recess, having a perimeter, formed in the cover 20. The wafer 14 is preferably received within the holder 24 so that the wafer 14 is placed flush with the cover 20, with the metallized side (the surface 12) facing downwardly and exposed to the electrolyte, as will be discussed more fully below. The wafer 14 is retained within the holder 24, in an inverted position, by a contact ring 26. The contact ring 26 preferably extends completely about the perimeter of the holder 24, and provides electrical contact with the metallized surface 12 of the wafer 14 received by the holder 24. The contact ring 26 is preferably formed of gold or platinized copper, and is preferably electrically connected to form an anode (represented by a plus sign) of an electrochemical etching circuit. The etching circuit further includes a power supply 28.

The corresponding cathode (represented by a minus sign) of the electrochemical etching circuit is formed by an electrolyte delivery system 30 associated with the cup-shaped cell 16. The electrolyte delivery system 30 generally includes a tubular head assembly 32, the center of which is received by a shaft 34 extending upwardly from the base 36 of the cup-shaped cell 16. The shaft 34 defines a center axis which intersects with the center (center axis) of the holder 24 and the wafer 14 which is received by the holder 24. The electrolyte delivery system 30 is preferably made of a corrosion-resistant material, such as stainless steel, for connection to the electrochemical etching circuit as a cathode.

In operation, the wafer 14 received by the holder 24 and the head assembly 32 of the electrolyte delivery system 30 are caused to move relative to each other. Such relative movement can be accomplished by maintaining the wafer 14 stationary, within the holder 24, while rotating the head assembly 32 of the electrolyte delivery system 30 beneath the wafer 24 (in the counter-clockwise direction, for example, as shown by the arrows in FIG. 1). To this end, the shaft 34 of the electrolyte delivery system 30 can be received by a tubular sleeve 38 extending from the base 36, for rotation within the sleeve 38 and beneath the holder 24. Alternatively, desired relative movement can be accomplished by rotating the wafer 14 within the holder 24 using an appropriate, otherwise conventional mechanism associated with the cover 20, such as a shaft 39 journaled for rotation within the cover 20 and engaging the fixture 24 while maintaining the head assembly 32 of the electrolyte delivery system 30 stationary beneath the holder 24. It is also possible, if desired, to simultaneously rotate both the holder 24 and the head assembly 32. In such cases, the holder 24 can be rotated in a direction opposite to the direction of rotation for the head assembly 32, or in the same direction, as is preferred for a particular application.

Figure 2:
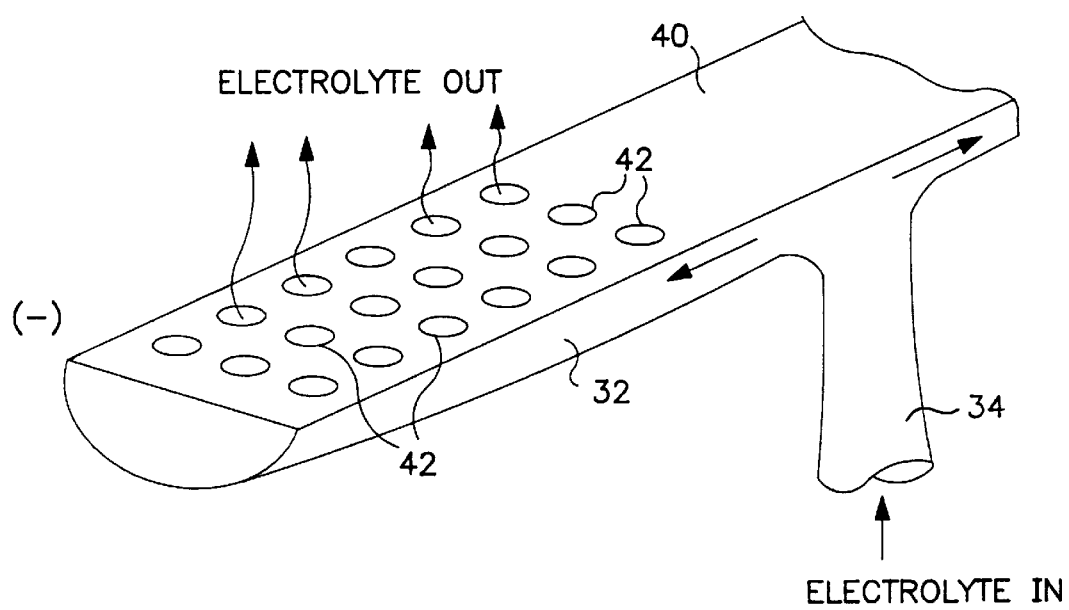
FIG. 2 is an enlarged, partial isometric view of the head assembly of the apparatus of FIG. 1.

In any event, a suitable electrolyte is caused to issue from the head assembly 32 and impinge upon the surface 12 of the wafer 14 received by the holder 24. To this end, and referring to FIG. 2, the head assembly 32 of the electrolyte delivery system 30 is preferably formed with a flat top plate 40 having a plurality of nozzles 42 through which the electrolyte can issue, for impinging upon the wafer 14. The spacing or interelectrode gap between the workpiece (i.e., the wafer 14), which serves as the anode, and the top plate 40 of the head assembly 32 of the electrode delivery system 30, which serves as the cathode, is preferably kept small to maintain effective electrolyte impingement and to allow the cell voltage to be kept as low as possible. An interelectrode gap of between 1 and 5 mm is preferred because a larger gap will tend to require a higher cell voltage while a lower gap will tend to entrap any gas bubbles which might issue from the apertures of the nozzles 42 formed in the top plate 40, leading to the potential for sparking and damage to the workpiece. An interelectrode gap of 3 mm is presently considered preferred.

The electrolyte is preferably a neutral salt solution such as potassium sulfate, potassium nitrate, sodium nitrate, and sodium chloride. Electroetching in such electrolytes may introduce a certain degree of roughness to the surface 12 of the wafer 14 due to the inability of the process to provide micro-smooth surfaces. For applications in copper planarization, however, where etching is generally stopped before the complete removal of the copper layer, etching can be followed by a chem-mechanical polishing (CMP) process to remove the surface roughness. The use of concentrated acids such as phosphoric acid can also provide smooth electropolished surfaces.

Referring again to FIG. 1, the selected electrolyte is preferably introduced to the etching apparatus 10 through the base 36 of the cup-shaped cell 16. To this end, the electrolyte is held in a reservoir 44 and is drawn from the reservoir 44 by a suitable pump 46. The pumped electrolyte is preferably filtered, using filter 48, and then passed through a conduit 50 which communicates with the base 36 of the cup-shaped cell 16. The conduit 50 can either communicate directly with the shaft 34 of the stationary head assembly 32, or with the tubular sleeve 38 of a rotatable head assembly 32, as is shown in FIG. 1.

Figure 3:
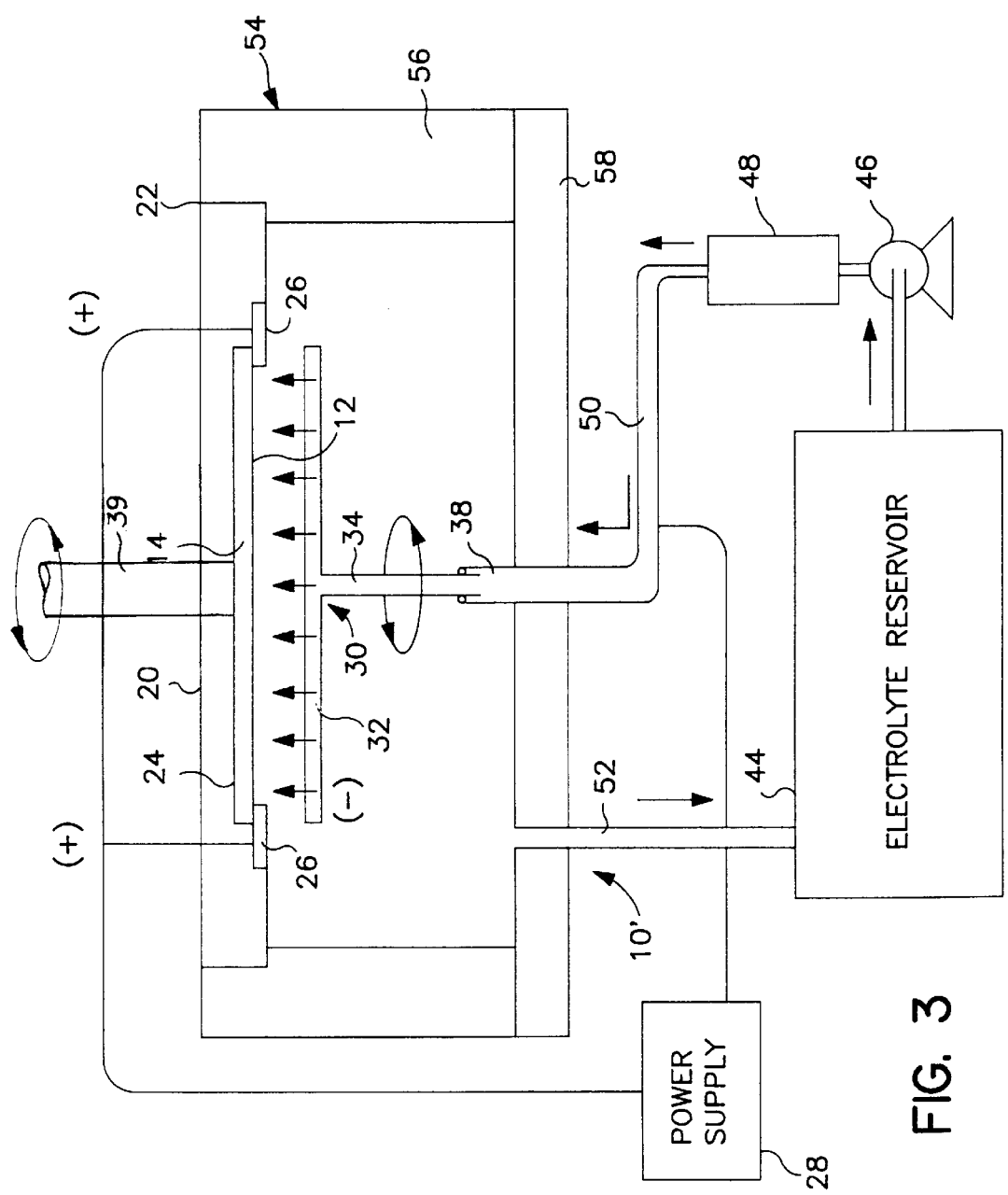
FIG. 3 is a cross-sectional view of an alternative embodiment of the electrochemical etching apparatus of the present invention.

A return conduit 52 also communicates with the base 36 of the cup-shaped cell 16, for returning electrolyte collected by the cup-shaped cell 16 to the reservoir 44. The curved sides 18 of the cup-shaped cell 16 assist in collecting electrolyte issuing from the head assembly 32, for return to the reservoir 44, and, therefore, curved sides are preferred. Referring to FIG. 3, however, it is also possible to provide an etching apparatus 10' with an electrolyte receiving cell 54 having straight (vertical, as shown in FIG. 3) side walls 56 and a flat base 58. The side walls 56 and the base 58 may be sloped, if desired, to assist with the collection of electrolyte for return to the reservoir 44.

Electroetching should be performed at or above the mass transport controlled limiting current for the metal dissolution reaction to take place. Operating under these conditions leads to a better surface finish and uniformity of metal dissolution. Problems due to non-uniformity may also be alleviated by adjusting the electrolyte flow and, accordingly, the current distribution (metal dissolution rate distribution) across the wafer 14. This can include the use of different nozzle sizes and configurations, provided along the head assembly 32, as will be discussed more fully below. Still further improvement can be achieved by rotating both the wafer 14 and the head assembly 32 in opposite directions.

The nozzles 42 associated with the head assembly 32 of the electrolyte delivery system 30 can be constructed in any of a variety of configurations to provide the desired volume of electrolyte to the surface 12 of the wafer 14. This can include configurations where the nozzles 42 are uniformly sized and spaced along the head assembly 32, if desired. In a preferred embodiment, however, the top plate 40 of the head assembly 32 will have a series of nozzles 42 which vary in size along the head assembly 32, to better compensate for edge effects of the etching process. For example, the nozzles 42 can vary in size from a larger diameter (e.g., 2 to 3 mm) at the center of the head assembly 32 to a smaller diameter (e.g., 1 to 2 mm) at the edges of the head assembly 32. A similar result can be achieved by varying the number of nozzles 42 provided along the head assembly 32, from a greater number at the center to a smaller number at the edges. Nozzles 42 which vary in both diameter and number can also be implemented, if desired for a particular application.

Figure 4:
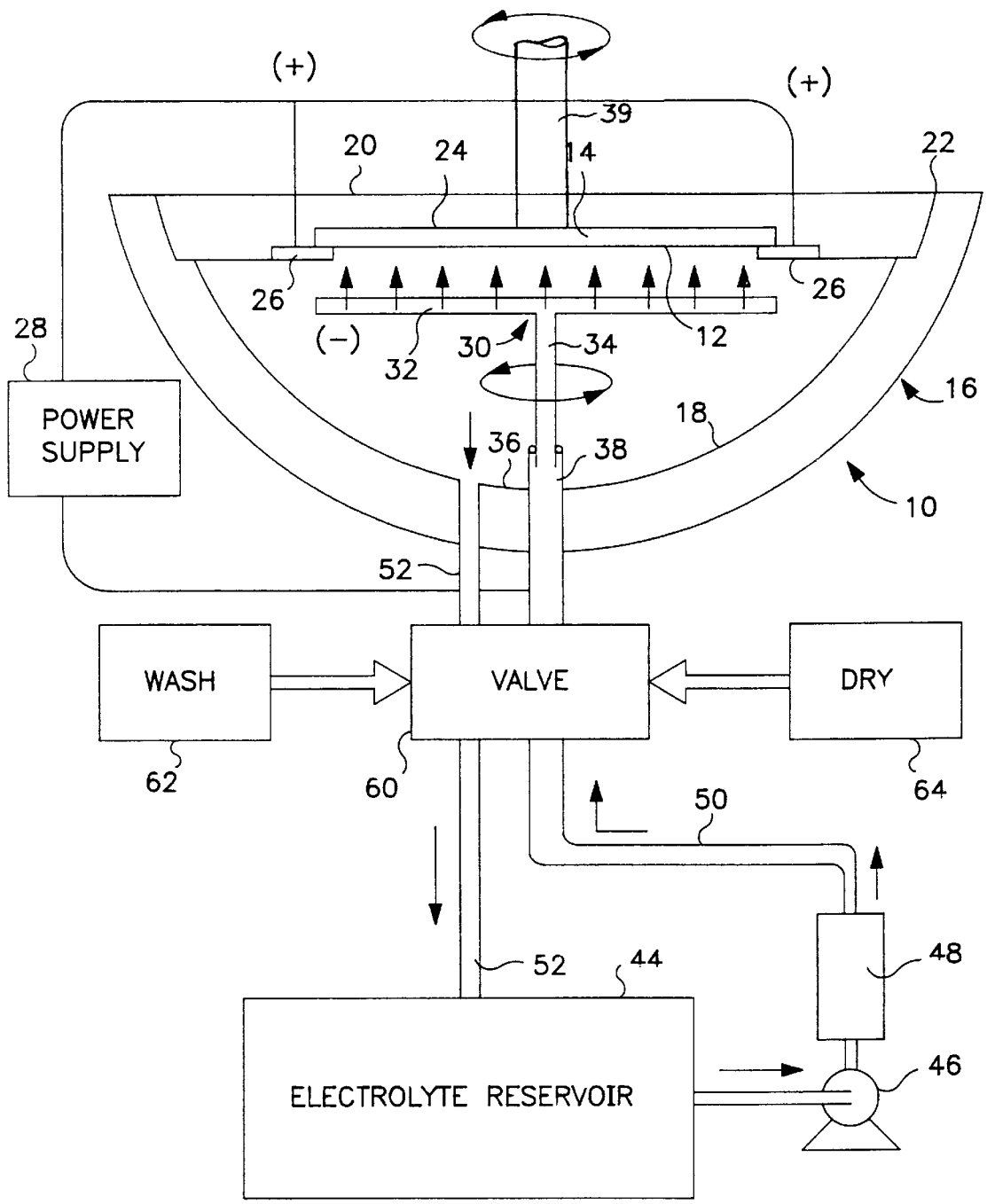
FIG. 4 is a cross-sectional view of an electrochemical etching apparatus capable of switching between different modes of operation.

The etching apparatus 10 can also be modified to include rinsing and drying functions. For example, FIG. 4 shows an etching apparatus which corresponds to the etching apparatus 10 of FIG. 1. In this embodiment, a valve 60 communicates with the conduits 50, 52. The valve 60 permits selective communication with the cup-shaped cell 16, and can be attached to separate systems for introducing desired media into the etching apparatus 10, through the conduit 50, and for receiving the corresponding media from the etching apparatus 10, through the conduit 52. For example, a three-way valve 60 can be used to connect the etching apparatus 10 with three different systems (media) to permit the etching apparatus 10 to be switched between three different modes of operation including an electrolytic etching mode tapping the electrolyte, a distilled water rinsing mode tapping a wash unit 62, and a warm nitrogen drying mode tapping a dry unit 64.

As an alternative to using a single etching apparatus 10 which can switch between three different modes responsive to a valve 60, the etching, rinsing, and drying functions can also be performed using three separate stations. For example, an appropriate mechanism, such as a robot, can carry the substrate, such as the wafer 14, among the three separate stations. The substrate is etched at a first station, rinsed at a second station, and dried at a third station.

Regardless of the implementation selected for use in accordance with the present invention, relative rotation between the wafer 14 (i.e., the anode) and the electrolyte delivery system 30 (i.e., the cathode), about an axis intersecting the center of the wafer 14 to be etched, has been found to provide faster etching of the wafer 14 when compared with scanning of the electrolyte delivery system from one end of the wafer to the other. Such scanning systems are disclosed, for example, in U.S. Pat. Nos. 5,284,554 and 5,486,282. The improvement for the system of the present invention is achieved because the surface area exposed to the cathode is maximized and constant. For this reason, such electroetching can be either current or voltage controlled. In addition, radially dependent etch non-uniformities can further be minimized using an electrolyte delivery system which includes nozzles that vary in size, number, or both size and number as previously described.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An apparatus for electrochemically etching a surface of a workpiece with an electrolyte, comprising:

an electrochemical etching circuit;

a cell having a base;

a cover mating with the cell to define an enclosure and having a holder adapted to receive the workpiece so that the surface of the workpiece faces toward the enclosure, the holder including an electrical contact connected to the electrochemical etching circuit and positioned to engage the surface of the workpiece;

a head electrically connected to the electrochemical etching circuit, the head extending from the base of the cell toward the holder and the cover and having a plurality of nozzles adapted to direct the electrolyte from the head toward the surface of the workpiece received by the holder; and means for rotating the workpiece within the enclosure and means for rotating the head within the enclosure, so that both the workpiece and the head are caused to rotate relative to each other.

2. The apparatus of claim 1 wherein the cell is cup-shaped and has curved side walls.

3. The apparatus of claim 1 wherein the cell has substantially straight side walls and a substantially flat base.

4. The apparatus of claim 1 wherein the holder is a recess formed in the cover, the recess having a perimeter, and wherein the electrical contact is a ring extending about the perimeter of the recess.

5. The apparatus of claim 4 wherein the ring is formed of an electrically conducting material adapted to connect the surface of the workpiece to the electrochemical etching circuit.

6. The apparatus of claim 5 wherein the ring is connected to the electrochemical etching circuit as an anode.

7. The apparatus of claim 1 wherein the head has a central portion, an end portion, and a shaft extending from the central portion beneath the holder and the cover toward the base of the cell.

8. The apparatus of claim 7 wherein the holder has a center and the shaft defines an axis which extends through the enclosure to the center of the holder.

9. The apparatus of claim 7 further comprising a tubular sleeve extending through the cell and receiving the shaft, the shaft rotating within the sleeve and beneath the holder.

10. The apparatus of claim 7 wherein the head has a top plate facing the holder, the plurality of nozzles disposed in the top plate.

11. The apparatus of claim 10 wherein the plurality of nozzles are uniform in configuration.

12. The apparatus of claim 10 wherein the plurality of nozzles have a configuration which varies along the top plate.

13. The apparatus of claim 12 wherein the nozzles have a diameter which decreases from the central portion of the head toward the end portion of the head.

14. The apparatus of claim 12 wherein the nozzles have a number which decreases from the central portion of the head toward the end portion of the head.

15. The apparatus of claim 1 further comprising:

a reservoir containing electrolyte;

a delivery tube in fluid communication with the head;

a pump conveying the electrolyte from the reservoir to the delivery tube; and a return tube connecting the base of the cell with the reservoir.

16. The apparatus of claim 15 further comprising a valve communicating with the delivery tube and the return tube.

17. The apparatus of claim 16 further comprising a dry unit communicating with the valve, wherein the valve is switchable between a first mode for electrochemically etching the surface of the workpiece and a second mode for drying the workpiece.

18. The apparatus of claim 17 further comprising a wash unit communicating with the valve, wherein the valve is switchable among the first mode, the second mode, and a third mode for washing the workpiece.

19. A method for electrochemically etching a surface of a workpiece with an electrolyte, comprising the steps of:

placing the workpiece in an apparatus including a cell and a cover which mates with the cell to define an enclosure, wherein the cover has a holder for receiving the workpiece and wherein the holder has an electrical contact connected to an electrochemical etching circuit;

positioning the workpiece in the holder so that the surface of the workpiece faces a head located within the enclosure, wherein the head includes a plurality of electrolyte-issuing nozzles and wherein the head is electrically connected to the electrochemical etching circuit;

retaining the workpiece within the holder;

electrically connecting the surface of the workpiece to the electrochemical etching circuit; and rotating the workpiece within the enclosure and rotating the head within the enclosure so that both the workpiece and the head are caused to rotate relative to each others while issuing the electrolyte from the nozzles of the head toward the surface of the workpiece retained in the holder.

20. The method of claim 19 wherein the surface of the workpiece is connected to the electrochemical etching circuit as an anode.

21. The method of claim 20 further comprising the step of connecting the head to the electrochemical etching circuit as a cathode.

22. The method of claim 19 wherein the step of rotating the workpiece and the head relative to each other further includes rotating the workpiece and the head in opposite directions.

23. The method of claim 19 wherein the step of rotating the workpiece and the head relative to each other further includes rotating the workpiece and the head in the same direction.

24. The method of claim 19 further comprising the step of axially aligning a shaft, which extends from a central portion of the head beneath the holder and the cover, with the center of the holder.

25. The method of claim 19 further comprising the step of drying the workpiece.

26. The method of claim 25 further comprising the step of switching the apparatus between a first mode for electrochemically etching the surface of the workpiece and a second mode for drying the workpiece.

27. The method of claim 26 further comprising the step of washing the workpiece.

28. The method of claim 27 further comprising the step of switching the apparatus among the first mode, the second mode, and a third mode for washing the workpiece.

29. The apparatus of claim 10 wherein the plurality of nozzles are disposed in the top plate to develop a surface area along the top plate which is substantially constant.

30. The method of claim 19 wherein the head includes a top plate for issuing the electrolyte, and wherein the step of issuing the electrolyte from the nozzles of the head includes developing a surface area along the top plate which is substantially constant.

* * * * *